(12) United States Patent
Parsons (10) Patent No.: US 6,239,432 B1
(45) Date of Patent: May 29, 2001

(54) IR RADIATION SENSING WITH SIC

(75) Inventor: James D. Parsons, Reno, NV (US)

(73) Assignee: Hetron, Reno, NV (US)

( * ) Notice: Subject to any disclaimer, the term of this patent is extended or adjusted under 35 U.S.C. 154(b) by 0 days.

(21) Appl. No.: 09/316,239

(22) Filed: May 21, 1999

(51) Int. Cl.$^7$ .................................................. G01J 5/00
(52) U.S. Cl. .................................. 250/338.1; 338/18
(58) Field of Search ........................ 338/18; 250/338.1

(56) References Cited

U.S. PATENT DOCUMENTS

| | | | |
|---|---|---|---|
| 4,695,733 | * | 9/1987 | Pesavento ............................ 250/551 |
| 5,025,243 | * | 6/1991 | Ichikawa .............................. 338/18 |
| 5,122,668 | * | 6/1992 | Kajiwara et al. .................. 250/370.01 |
| 5,868,497 | * | 2/1999 | Jung ..................................... 374/179 |

OTHER PUBLICATIONS

Choyke, W.J., "Optical and Electronic Properties of SiC", NATO ASI Series vol. "The Physics and Chemistry of Carbides, Nitrides and Borides", Manchester, England, pp 1–25, (Sep. 18–22, 1989).

Spitzer et al., "Infrared Properties of Hexagonal Silicon Carbide", Physical Review, vol. 113, No. 1, pp. 127–132, (Jan. 1, 1959).

* cited by examiner

Primary Examiner—Constantine Hannaher
(74) Attorney, Agent, or Firm—Koppel & Jacobs (57) ABSTRACT

SiC, preferably in single crystal form, is employed as an IR radiation sensor with high temperature and power capabilities. Applications include sensing the power or energy from an IR radiation source, a contactless temperature sensor for another body heated by IR radiation, and an IR controlled varistor.

32 Claims, 5 Drawing Sheets

IR RADIATION SENSING WITH SIC

BACKGROUND OF THE INVENTION

1. Field of the Invention

This invention relates to the use of SiC for IR radiation sensing and resistance control.

2. Description of the Related Art

IR radiation is presently sensed, for applications such as measuring the power or energy output from IR lasers, by pyroelectric, bolometer and calorimeter detectors. Generally, pyroelectric and bolometer detectors employ materials that directly absorb IR; pyroelectric materials include lithium niobate and tantalum niobate; bolometer materials include silicon, germanium, gallium arsenide, metal-oxide ceramic thermistors and various glasses. Generally, calorimeter detectors employ materials that must be coated with an IR-sensitive absorption coating. The performance of IR sensing detectors is constrained by the IR-sensor material's capacity to absorb energy without damage; which limits the maximum energy/power intensity, maximum exposure time and minimum volume and area for the sensor. All pyroelectric, bolometer and calorimeter materials have limited thermal shock tolerances.

Materials currently used for the direct absorption of IR radiation are easily damaged if they get too hot (above about 400° C.), or if the sensor temperature increases too rapidly. To sense the power or energy output of medium and high power IR lasers, present materials are exposed to only a fraction of the output IR energy by interposing a beam splitter or a disbursing medium between the laser and the sensor. However, this results in reducing the power or energy measurement to an estimate. Furthermore, presently available sensors for medium and high power IR sources require fan or water cooling, and are subject to calibration drift.

A related application for IR radiation sensitive materials is in sensing the temperature of other materials that are heated by IR radiation. For example, the rapid thermal annealing (RTA) process, used extensively in the semiconductor industry, uses high intensity IR lamps to ramp the temperature of semiconductor wafers (principally silicon) by several hundred degrees centigrade per second. Wafer temperatures are presently monitored by remote sensing using either optical or IR pyrometers, or by direct contact thermocouples.

Pyrometers measure the wafer temperature by absorbing radiation emitted from the wafer surface through a transparent view port in the RTA process chamber wall. This type of temperature sensing is limited by a need to know the precise emissivity of the observed wafer surface, a need to prevent particulates or dispersive gas between the wafer surface and view port or any deposits on the view port or wafer surface, and a requirement to avoid any changes in the wafer surface such as contamination or chemical reaction or texture changes.

Thermocouples measure the wafer temperature by touching its surface. Key problems with this approach are that the thermocouple must be enclosed to prevent reactions between it and the wafer, the thermocouple-wafer contact is very difficult to ensure because the wafer is spun at about 1200 rpm to ensure uniform processing, and contacting the wafer with the thermocouple actually changes the local temperature.

Materials presently used for IR radiation power or energy sensing could theoretically also be used as temperature sensors, but they would not survive the environments or temperatures often required, particularly RTA processing in which temperatures can reach 1300° C.

SUMMARY OF THE INVENTION

The invention provides a unique approach to IR radiation sensing that is applicable to IR power and energy sensing, heat sensing, and IR controlled varistors. The new IR radiation sensor is formed from SiC, preferably in a single crystal structure. A SiC body receives IR radiation while an electrical circuit applies an electrical signal to the SiC body, which responds to the radiation by changing its response to the electrical signal. When employed as an IR energy and/or power sensor, either a constant current or a constant voltage is applied to the SiC body which receives the IR radiation, and an output circuit provides an indication of the IR energy and/or power incident on the SiC body as a function of the body's resistance.

The invention can also be employed to sense the temperature of a test body, such as a wafer in an RTA process chamber. In this application the SiC body is positioned such that the IR-radiation intensity received by it, relative to the test body is known. As in the IR energy/power sensor, a constant current or voltage is applied to the SiC body, while an output circuit is calibrated to produce an indication of the test body's temperature as a function of the SiC resistance.

The invention can also be employed as a varistor, in which a laser directs a controlled IR beam onto an SiC body that is incorporated into a larger circuit; the laser cooperates with the SiC body to function as a controlled varistor.

The electrical resistance of pure SiC normally has a positive temperature coefficient, resulting from direct absorption of IR energy by the lattice. Its temperature coefficient (TC) can be 'tuned' by incorporating impurity atoms. Impurity atoms can be used to add lattice IR energy absorption bands. IR energy can be absorbed by electrically active impurity atoms (dopants), which are incompletely ionized at room temperature (in the absence of the IR radiation) Direct IR energy absorption by the lattice or impurity atoms produces a positive TC, and absorption by dopant ionization produces a negative TC. Since the different absorption mechanisms operate at different IR wavelengths, the SiC body can be tuned to produce a desired response as a function of IR radiation wavelength.

In some applications, such as temperature sensing and certain varistors, the SiC body is secured in a mounting structure having an AlN substrate. An electrically conductive mounting layer that includes W, WC or $W_2C$ electrically and mechanically connects the SiC body to the substrate via electrodes on the body. The mounting layer itself can have a W, WC or $W_2C$ adhesion layer adhered to the substrate, and one or more metallization layers adhered to the adhesive layer and bonded to electrodes for the SiC body, with the metallization layers having a coefficient of thermal expansion not greater than 3.5 times that of the substrate over the temperature range of interest. The mounting layer can be discontinuous, consisting of a plurality of mutually separated mounting elements that are connected to respective mutually separated electrodes on the SiC body.

The invention produces a very stable and reproducible resistance vs temperature characteristic, can withstand both absolute temperatures of at least 1,400° C. and very rapid temperature ramping without the need for fan or water cooling, is robust and not easily damaged, maintains calibration well, and offers improvements in the ability to withstand high IR energy/power intensities, exposures times and thermal shock. Smaller SiC devices can be used because of their favorable high power density handling capabilities, without being subject to large piezoelectric signals that can be induced by focused laser pulses on other materials.

These and other features and advantages of the invention will be apparent to those skilled in the art from the following detailed description, taken together with the accompanying drawings.

DETAILED DESCRIPTION OF THE INVENTION

The invention employs SiC as an IR radiation sensor, with applications including the sensing of IR power or energy emitted from an IR radiation source such as a laser, contactless sensing of the temperature of other bodies which are heated by IR radiation, and controlled varistors for electrical circuits. SiC is known to have an electrical resistance which varies with temperature. For example, see Spitzer et al. "Infrared Properties of Hexagonal Silicon Carbide", Physical Review, Vol. 113, No. 1 (1959); and W. J. Choyke, "Optical and Electronic Properties of SiC", included in "The Physics and Chemistry of Carbides, Nitrides and Borides", NATO ASI Series, Sep. 18–22, 1989. However, SiC has not previously been proposed for sensing IR radiation; its temperature properties have been measured by heating it either by direct contact or by passing a current through it.

IR sensing with SiC is accomplished via direct absorption by lattice atoms or electrically inactive impurity atoms, or by incompletely ionized, electrically active impurity (dopant) ionization. The particular mechanism which dominates depends upon the IR radiation wavelength. IR radiation absorbed by lattice and electrically inactive impurity atoms is converted directly into heat energy; this type of absorption causes the resistance of the sensor material to increase. IR radiation absorbed by incompletely ionized, electrically active impurity ionization causes the resistance of the SiC to drop. Thus, the SiC response can be "tuned" as a function of IR radiation wavelength to achieve a desired resistance-temperature coefficient (RTC). While the invention can be implemented with polycrystalline SiC, a single-crystal structure is preferred because of the absence of grain boundaries which can cause a drift in the material's temperature response. Grain boundaries present in polycrystalline SiC can accumulate impurities over time and alter the material's RTC.

Figures 1, 2, 3, 4, 9:
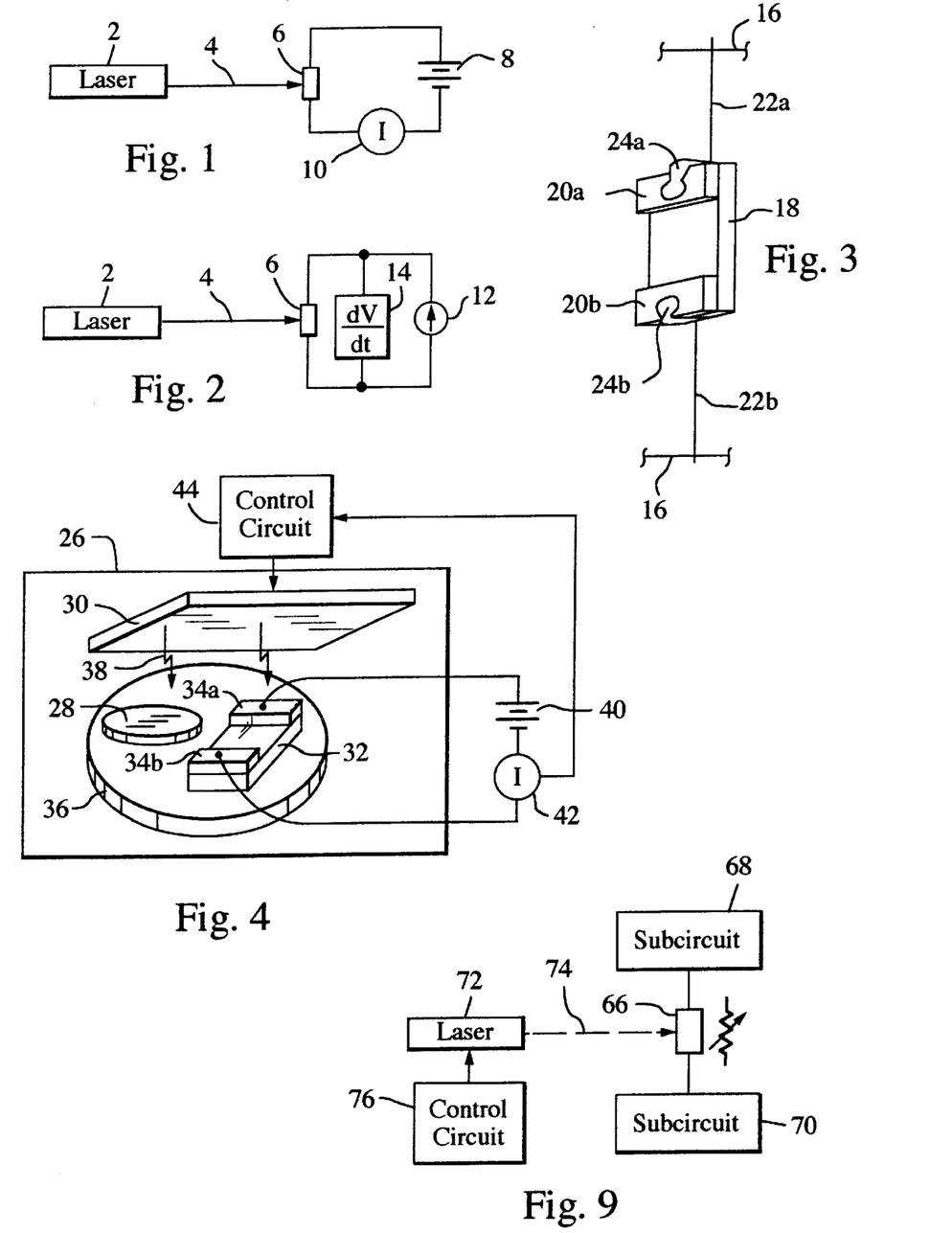
FIG. 1 is a simplified schematic diagram of the invention employed to sense the energy of an IR laser beam.
FIG. 2 is a simplified schematic diagram of the invention employed to sense the power of an IR laser beam.
FIG. 3 is a simplified perspective view of a suspended IR sensor in accordance with the invention.
FIG. 4 is a simplified schematic diagram of the invention used as a temperature sensor in an RTA process.
FIG. 9 is a block diagram of a varistor application for the invention.

Among the IR radiation applications for SiC are beam energy and power sensing, illustrated in FIGS. 1 and 2, respectively. This application could be used, for example, to sense the energy or power of an IR laser beam or focused radiation from an IR lamp. SiC is particularly advantageous for these applications, since it can absorb very high energy doses over very short time periods, without being damaged. Thus, it can be used for energy/power sensing of emitted energy from medium power (powers in the range of 10 watts–300 watts) and many high power (powers in excess of 300 watts) IR lasers, with the SiC sensing surface exposed to the entire output energy without fan or water cooling, withstanding temperatures in excess of 1300° C. The superior high power density handling capability of SiC permits the use of smaller volume SiC sensor elements, relative to those now employed, for a given power; further, the smaller size of SiC sensor elements facilitates self-cooling after absorbing a laser pulse more rapidly than other materials used to sense IR radiation. Furthermore, the high thermal conductivity of SiC provides for a rapid distribution of absorbed energy over the entire sensor volume, which substantially reduces the susceptibility of the sensor element to damage by thermal shock (due to large lateral temperature gradients that may be induced when a small area of the sensor element is exposed to a high energy laser beam. The low piezoelectric coefficients of SiC (relative to pyroelectric materials), coupled with its high thermal conductivity (higher than Cu at room temperature) inhibits the generation of large piezoelectric signals in the sensor from focused laser pulses. In general, the favorable thermal shock tolerance of SiC allows it to absorb laser pulses containing high energy, and to be used for relatively long exposures to IR radiation at high energy/power intensities in a small volume and area sensor.

SiC can be doped to produce a highly stable and reproducible RTC that, particularly for single crystal SiC, will not drift out of calibration. Repeated exposure to concentrated doses of IR radiation will not change the sensor properties. Furthermore, due to its phonon spectrum and impurity ionization energies, SiC can directly absorb many important IR wavelengths, extending to 25 micrometers. This makes it unnecessary to use an IR sensitive absorption coating employed by virtually all IR radiation detectors, when employed to detect wavelengths longer than about 2.5 micrometers.

The use of SiC as an IR radiation energy sensor is illustrated in FIG. 1. An IR radiation source such as laser 2 emits an IR beam 4 within a specified waveband (defined herein to include a single wavelength). An SiC sensor body 6 is placed in the beam path, preferably receiving the entire beam. A constant voltage source 8 applies a constant voltage across the SiC, while a current sensor 10 senses the resulting current through the SiC.

The SiC temperature changes in response to the IR radiation, with its consequent resistance change depending upon the radiation wavelength(s), intensity and exposure time. Since there is a fixed relationship between the SiC temperature and its resistance for a given doping level, the SiC temperature can be sensed as a function of the current flowing through it, as sensed by a current meter 10. There is also a direct correspondence between the IR radiation energy absorbed by the SiC and its temperature. Accordingly, the current response of the SiC will vary in a one-to-one relationship with the IR beam energy. Calibrating the current meter 10 to the SiC's RTC, and also to cancel the effect of any current-induced heating, thus allows for a direct readout of the IR beam energy.

Rather than applying a constant voltage and sensing the resulting SiC current as in FIG. 1, a constant current could be applied with the output circuit sensing the SiC voltage response rather than its current. This is illustrated in FIG. 2, which is designed to sense the IR beam power rather than its energy. A constant current source 12 applies a constant current to the SiC, with a differentiating voltage sensor 14 connected across the SiC body. Differentiating voltage sensor 14 detects the instantaneous rate at which the SiC resistance, and thus its temperature, is changing. This provides a direct indication of the instantaneous power in IR beam 4.

The SiC sensor is preferably suspended within a housing so that it is as thermally isolated as possible. This is illustrated in FIG. 3, in which the housing walls are indicated by reference numeral 16. An SiC chip 18 has conductive contact electrode pads 20a and 20b at its opposite ends, with lead wires 22a and 22b electrically and mechanically connected to the SiC chip assembly via respective clips 24a and 24b, such as alligator clips, or by solder or electrical contact pins upon which the clip can be mounted. The lead wires 22a, 22b are attached to the chamber walls to suspend the SiC chip in place, and also to provide electrical access to the chip while effectively thermally isolating it from the exterior of the chamber. Suspension by contact clips is particularly useful for lower temperature ranges such as those experienced with intermediate power lasers, which generally do not exceed about 500° C. The clip electrode pads 20a, 20b could be left off if desired, with the clips connected directly to opposite ends of the chip.

FIG. 4 illustrates a system in which SiC is again exposed to IR radiation, but this time for the purpose of sensing the temperature of a nearby test body. The figure represents a simplified, not-to-scale RTA chamber 26. The invention is used to sense the temperature of a semiconductor wafer 28, typically silicon, that is undergoing rapid thermal excursions under the influence of radiation from an IR lamp 3C. An SiC chip 32 with metalized contacts 34a, 34b at its opposite ends is positioned on the same working platform 36 as the wafer 28 or at some other location where the intensity of IR radiation 38 it receives is a known proportion of that received by the wafer.

A constant voltage from voltage source 40 is applied across contacts 34a and 34b to generate currents to the SiC body 32 that varies as a function of the SiC resistance, which in turn reflects the SiC temperature. The current flow, and hence the SiC temperature, is sensed by a current meter 42. Alternately, a constant current source could be used and the SiC voltage sensed.

Once the SiC body's temperature response to IR radiation has been calibrated to that of the semiconductor wafer 28, the SiC body can be used to sense the temperature of the wafer in a contactless fashion by exposing it to the same IR source, so long as its distance from the source is maintained constant relative to that of the wafer. The calibration can include any adjustment necessary to cancel out the effect of IR radiation intensity differentials between the SiC chip and the wafer resulting from any difference between the distances from the IR source to the wafer and to the SiC chip. The SiC can then be used to sense the temperature of similar wafers placed on the same support platform 36, with the current meter 42 calibrated to provide an indication of the wafer temperatures. This allows for a control over the energization of the IR lamp 30 to assure that the wafer temperature follows a desired profile. The control mechanism is illustrated in FIG. 4 by an output from current meter 42 supplying an indication of the wafer temperature to a control circuit 44, which in turn controls the energizing signal for the IR lamp 30 so that the emitted IR radiation keeps the wafer along the desired temperature profile.

Figure 5:
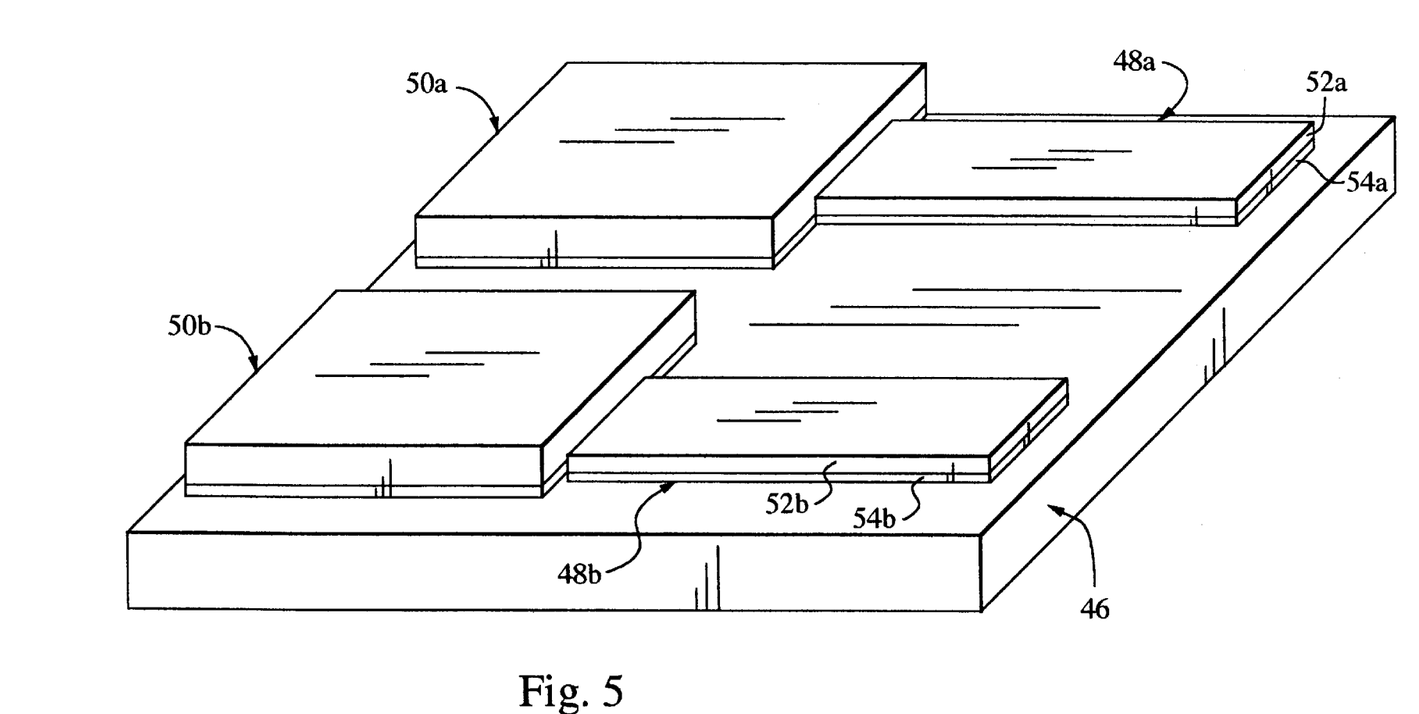
FIG. 5 is a perspective view of a support structure for the new IR sensor.

A preferred mounting structure for the SiC chip 32 which securely holds the chip in place over a very wide temperature range, typically 1300° C. or more, is shown in FIG. 5. An AlN die 46 functions as a substrate for the mounting mechanism. An electrically conductive mounting layer for the SiC chip is patterned on the substrate 46 into a pair of mounting elements 48a and 48b, one for each of the SiC chip contacts. The mounting elements can consist of either a thick or a thin film of tungsten (W), WC $W_2C$. They provide an electrical current path between an overlying SiC chip and substrate electrode pads 50a, 50b that are offset laterally from and in contact with mounting elements 48a and 48b, respectively. The mounting elements adhere to the AlN die 46, and provide a bond contact to the SiC chip contacts. W, WC and $W_2C$ satisfy this requirement by adhering to the AlN substrate 46. They can be applied in the correct stoiciometry to the AlN die surface by any of several different vapor-phase deposition techniques, such as RF/DC sputtering, RF/DC co-sputtering, e-beam evaporation, and chemical vapor deposition. The AlN substrate surface to which they are applied should be roughened so that adhesion occurs by physical bonding, rather than chemical bonding. The film density can be increased and the grain boundary reduced by thermal annealing in the range of 800° C.–1400° C. in a vacuum or inert atmosphere such as Ar or $N_2$ with the density and grain growth being dependent upon the time spent at a particular temperature.

Metallization layers 52a, 52b can be deposited over underlying W, WC or $W_2C$ films 54a, 54b if desired to increase the cross-sectional area of the mounting elements, to protect the underlying layers 54a, 54b from corrosion, and/or to enhance the bonding to the SiC chip contacts. One or more metallization layers may be employed. Virtually any metals can be used for temperatures up to about 800° C. Platinum is suitable up to about 1400° C. and gold-platinum alloys up to about 1300° C. in an oxidizing environment; nickel, palacium, platinum and their alloys and intermetallics, and nickel-chromium alloys can be used up to about 1400° C in a vacuum, inert or reducing environment.

The electrode pads 50a, 50b comprise lateral extensions of the mounting elements 48a, 48b, and have the same basic structure. However, as illustrated in FIG. 5, an overmetallization layer on the electrode pad may have a thickness greater than on the mounting elements to facilitate the attachment of lead wires. In general, the total thickness of the overlay metallization on the electrode pads 50a, 50b should be at least 0.05 times the lead wire diameter, and the temperature expansion coefficients of the metallization layer and lead wires should be closely matched. Furthermore, the metallization layer should have a thermal coefficient of temperature expansion not greater than about 3.5 times of the substrate over the intended temperature range.

Figure 6:
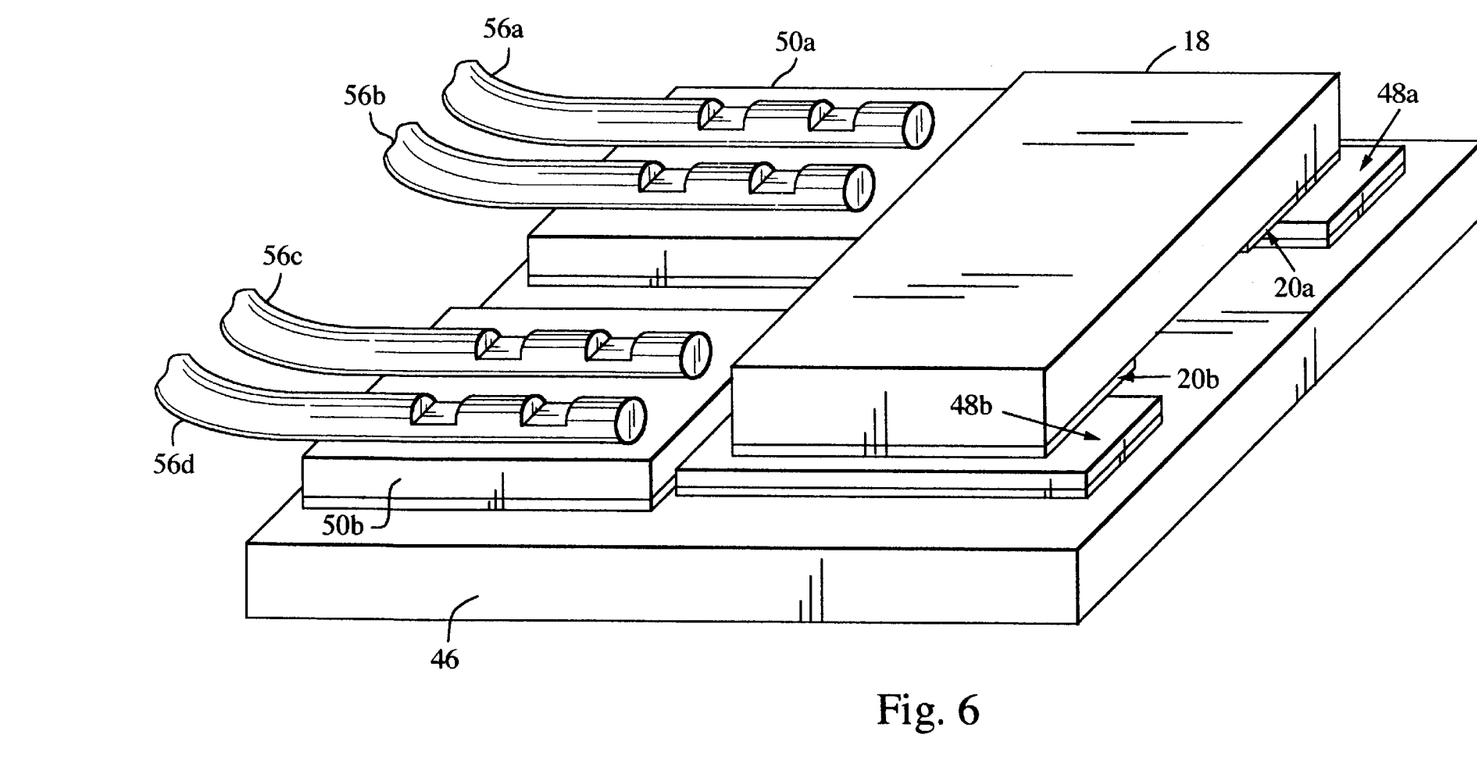
FIG. 6 is a perspective view of the support structure shown in FIG. 5, with an IR sensor and lead wires in place.

FIG. 6 illustrates the mounting structure of FIG. 5 after the attachment of an SiC chip 18 to the mounting elements, lead wires 56a, 56b to electrode pad 50a, and lead wires 56c, 56d to electrode pad 50b. The SiC chip 18 may contain thin films comprised of other semiconductor materials and compositions, so long as at least 90% of the chip thickness is SiC. Its contacts 20a, 20b are bonded to mounting elements 48a, 48b, respectively. The lead wires are preferably connected to the electrode pads by parallel gap welding, with the two flattened areas in each lead wire representing the locations at which the weld heads contact the lead wires.

Figure 7:
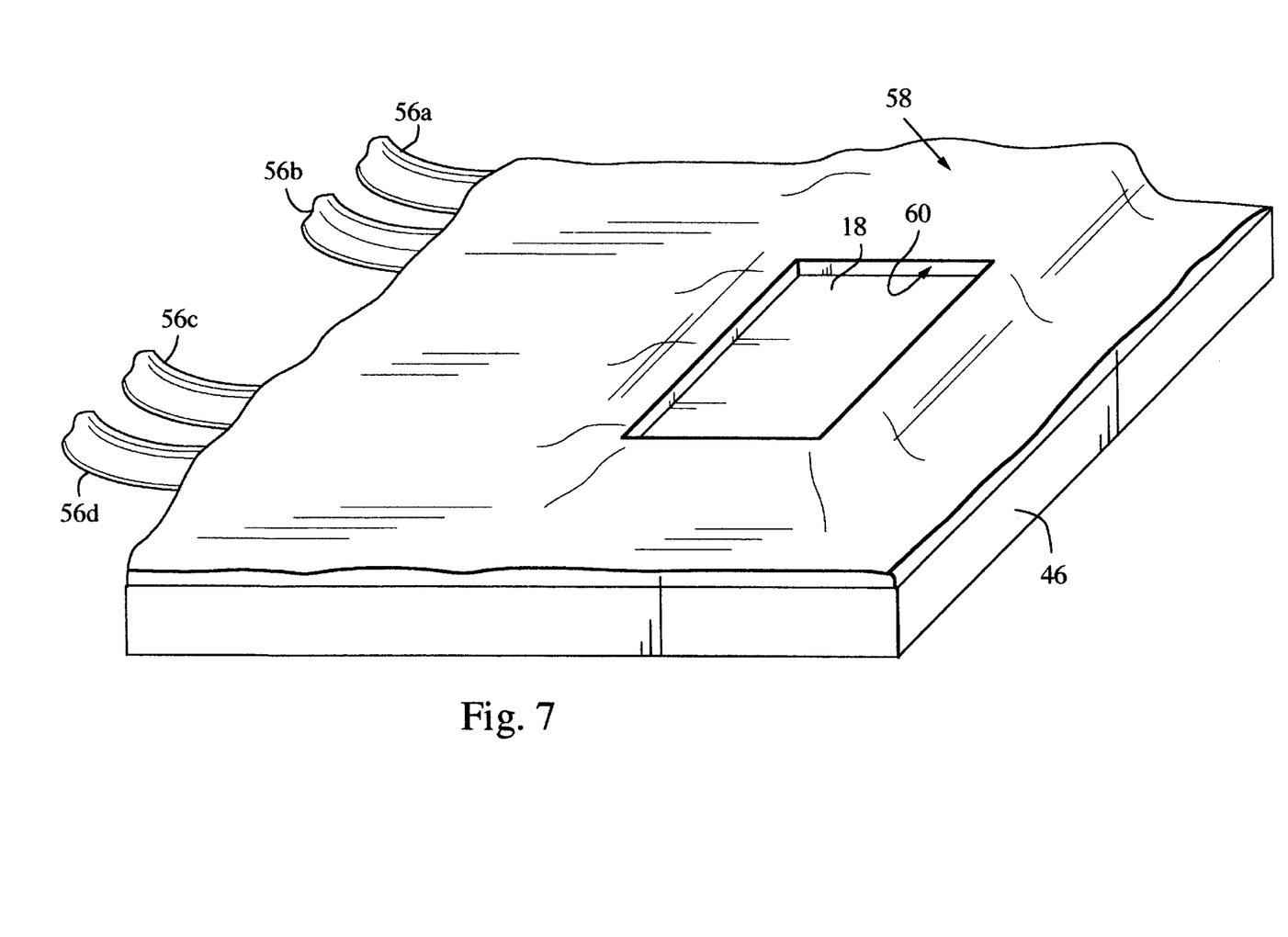
FIG. 7 is a perspective view of the structure shown in FIG. 6 with an encapsulation that exposes the IR sensor.

For extra protection, an encapsulated structure such as that illustrated in FIG. 7 can be used. This structure is the same as in FIG. 6, but adds a reacted borosilicate mixture (RBM) encapsulation 58 over the upper portion of the AlN substrate 46, with a window 60 in the encapsulation which exposes the underlying SiC chip 18 to applied IR radiation. The RBM adheres to the underlying material by chemically reacting with it to form an oxide interface layer as the borosilicate mixture is reacted. The RBM forms an environmental barrier over the surface which it encloses if, within the temperature range of the thermal cycling applied to the structure, either the RBM thermal expansion coefficient closely matches that of the material which it encloses, or the RBM viscosity is less than its Littleton Softening Point (approximately $10^6$ pascal second).

Figure 8:
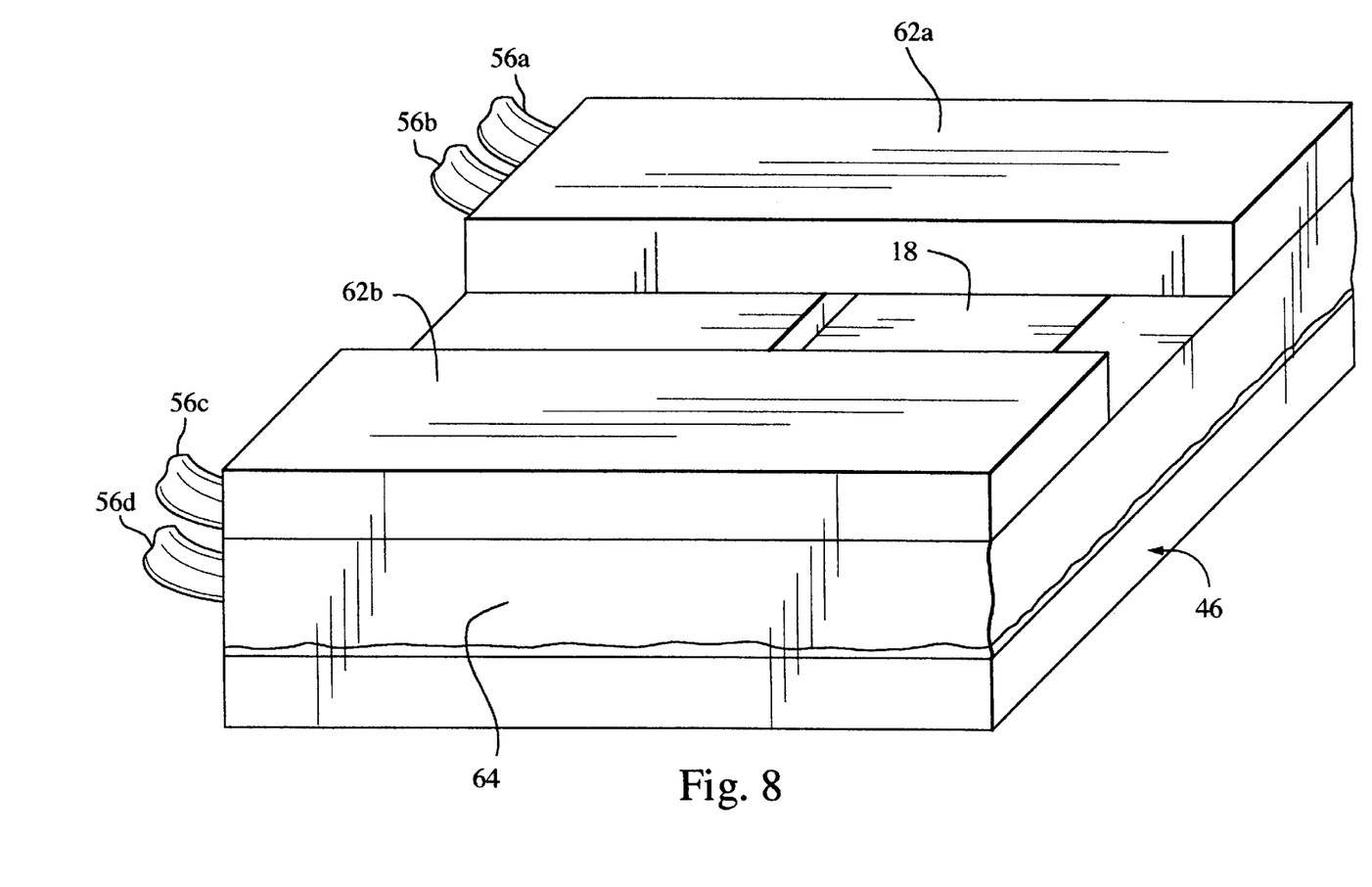
FIG. 8 is a perspective view of the IR sensor of FIG. 6 with an alternate protective structure.

FIG. 8 illustrates another variation in the mounting structure in which, in addition to the underlying AlN die 46, a pair of smaller and mutually spaced AlN die covers 62a, 62b are placed over the structure of FIG. 6 and held together with the underlying substrate 46 by an RBM 64, with a portion of the upper surface of SiC chip 18 exposed to IR radiation.

The application of the invention in connection with temperature sensing has been described in the context of RTA. The temperature sensing capability also has numerous other applications, such as heating, ventilation and air conditioning (HVAC), space heating, drying and curing, food processing and preparation, ovens and tunnel kilns, packaging machinery, textile machinery, vacuum forming and sheet metal processing.

As noted above, SiC can be doped to tune its temperature response to various IR wavelengths. Since SiC is a Group IV compound, any Group IIIA or IIIB element can be used as a P-type dopant, and any Group V element can be used as an N-type dopant. Each different dopant element has a different activation energy, which is inverse to its activation wavelength. The particular activation wavelength depends not only upon the dopant employed, but also upon the SiC polytype, such as 2H, 4H, 6H, 8H, 15R etc.; each polytype has a different band gap and electrically active impurity ionization energy.

The use of the invention as an IR radiation controlled varistor is illustrated in FIG. 9. An SiC body 66 which functions as a varistor forms part of an overall electrical circuit, illustrated as subcircuits 68 and 70 connected by varistor 66. A laser 72 directs an IR beam 74 onto the SiC body at a wavelength to which the varistor 66 is sensitive, and is governed by a control circuit 76. Using an IR radiation wavelength (or wavelength range) that is directly absorbed by lattice atoms and/or impurity atoms in the varistor 66, the varistor resistance increases exponentially when the laser is operated. This characteristic can be used, for example, to shut off current flow during emergency situations, or as a switch to turn electronics on and off as a function of some other parameter applied to the control circuit 76. The varistor's response to the electrical signal from subcircuits 68 and 70 thus changes between conductive and nonconductive as a function of the incident IR radiation.

An advantage of SiC in this varistor application is that it can act as a low resistance part of the overall circuit that is capable of handling very high currents because of its inherent high power capability. Instead of being limited to an on/off switch, the varistor 66 could control the functioning of the overall circuit in other ways by being operated to provide intermediate resistance levels under the influence of a precisely controlled IR laser.

While several embodiments of the invention have been shown and described, numerous variations and alternate embodiments will occur to those skilled in the art. Accordingly, it is intended that the invention be limited only in terms of the appended claims.

I claim:

1. An IR radiation controlled circuit, comprising:
   an SiC IR absorbent body exposed to receive IR radiation, and
   an electrical circuit connected to apply an electrical signal to said SiC body,
   said SiC body responding to incident IR radiation by changing its response to said electrical signal, and secured in a mounting structure which comprises an AlN substrate, and an electrically conductive mounting layer including W, WC or $W_2C$ that electrically and mechanically connects said SiC body to said substrate.

2. The IR radiation controlled circuit of claim 1, said SiC body comprising single crystal SiC.

3. The IR radiation controlled circuit of claim 1, wherein said SiC body includes a Group III or Group V dopant.

4. The IR radiation controlled circuit of claim 1, wherein said electrical circuit applies a constant current or a constant voltage to said SiC body, and includes an output circuit that provides an indication of the IR energy and/or power incident on said SiC body as a function of the SiC body's resistance.

5. The IR radiation controlled circuit of claim 1, wherein said SiC body is positioned such that its exposure to IR radiation is known relative to the level of IR radiation received by a test body whose temperature it is desired to measure, and said electrical circuit applies a constant current or a constant voltage to said SiC body and includes an output circuit that produces an indication of the test body's temperature as a function of the SiC body's resistance.

6. The IR radiation controlled circuit of claim 1, further comprising a laser having a controlled output and directed at said SiC body to control its resistance as a function of the laser output, said electrical circuit incorporating said SiC body together with said laser as a varistor.

7. The IR radiation controlled circuit of claim 1, said mounting layer comprising a discontinuous layer having a plurality of mutually separated mounting elements that are connected to respective mutually separated portions of said SiC body.

8. The IR radiation controlled circuit of claim 1, said mounting layer comprising a W, WC or $W_2C$ adhesive layer adhered to said substrate, and a metallization layer adhered to said adhesive layer and bonded to electrodes for said SiC body, said metallization layer having a coefficient of thermal expansion not greater than about 3.5 times that of said substrate over a temperature range of interest.

9. The IR radiation controlled circuit of claim 1, further comprising a plurality of electrode pads having the same composition as said mounting layer, electrically and mechanically connected to said substrate and electrically connected to said mounting layer.

10. The IR radiation controlled circuit of claim 9, wherein said electrode pads are positioned lateral to said SiC body.

11. The IR radiation controlled circuit of claim 10, said electrode pads comprising lateral extensions of said mounting layer.

12. The IR radiation controlled circuit of claim 11, said SiC body including spaced electrical contacts, and said mounting layer comprising a W, WC or $W_2C$ adhesive layer adhered to said substrate and a metallization layer adhered to said adhesive layer and bonded to said SiC body contacts, said metallization layer having a greater thickness at said electrode pads than at said mounting elements.

13. The IR radiation controlled circuit of claim 9, further comprising electrically conductive lead wires electrically and mechanically connected to said electrode pads.

14. The IR radiation controlled circuit of claim 13, further comprising an encapsulation formed from a borosilicate mixture over said substrate, but leaving at least a portion of said SiC body exposed to receive IR radiation.

15. The IR radiation controlled circuit of claim 14, said encapsulation having (a) a temperature coefficient of expansion closely matching that of said SiC body and substrate, or (b) a viscosity less than its Littleton softening point.

16. The IR radiation controlled circuit of claim 9, further comprising a cover of the same material as said substrate extending over said SiC body and bonded to said substrate by an encapsulation formed from a borosilicate mixture, said encapsulation together with said cover encapsulating the upper surface of said substrate while leaving at least a portion of said SiC body exposed to receive IR radiation.

17. The IR radiation controlled circuit of claim 1, said electrical circuit including lead wires connected to communicate electrical signals with, and mechanically suspend, said SiC body.

18. A sensor for IR radiation power or energy, comprising:
   an SiC body exposed to receive IR radiation,
   an excitation circuit arranged to apply either a controlled voltage or a controlled current to said SiC body, and
   an output circuit including a current sensor for said SiC body in the case of a controlled voltage from said excitation circuit or a voltage sensor for said SiC body in the case of a controlled current from said excitation circuit, said output circuit providing an indication of the IR radiation power or energy incident on said SiC body within a waveband of interest,
   wherein said SiC body is secured in a mounting structure which comprises an AlN substrate, and an electrically conductive mounting layer including W, WC or $W_2C$ that electrically and mechanically connects said SiC body to said substrate.

19. The sensor of claim 18, further comprising an IR radiation source positioned to direct IR radiation onto said SiC body, wherein said output circuit provides an indication of the IR power or energy emitted by said IR source within said waveband of interest.

20. The sensor of claim 19, said IR radiation source comprising a medium or high power laser.

21. The sensor of claim 20, wherein said laser is arranged to direct substantially its entire output onto said SiC body.

22. The sensor of claim 18, wherein said SiC body is doped so that it responds to IR radiation within said waveband of interest by changing its resistance in a manner determined by the doping level.

23. A contactless temperature sensor for a test body that is exposed to IR radiation, comprising:
   an SiC body positioned such that its exposure to IR radiation is known relative to the level of IR radiation received by a test body whose temperature it is desired to measure,
   an excitation circuit connected to apply either a controlled voltage or a controlled current to said SIC body, and
   an output circuit including a current sensor for said SiC body in the case of a controlled voltage from said excitation circuit or a voltage sensor for said SIC body in the case of a controlled current from said excitation circuit, said output circuit providing an indication of the test body's temperature as a function of the SIC body's resistance,
   wherein said SiC body is secured in a mounting structure which comprises an AlN substrate, and an electrically conductive mounting layer including W, WC or $W_2C$ that electrically and mechanically connects said SiC body to said substrate.

24. The temperature sensor of claim 23, wherein said test body comprises a semiconductor, and further comprising a rapid thermal annealing (RTA) chamber housing said semiconductor and SiC bodies, said output circuit providing a signal to control the operation of said RTA chamber.

25. An IR radiation controlled varistor circuit, comprising:
   an operating circuit,
   an SiC body included in said operating circuit, and
   a controllable IR source arranged to direct IR radiation onto said SiC body and to control its resistance, and thereby the operation of said operating circuit, as a function of the characteristics of said IR radiation,
   wherein said SiC body is secured in a mounting structure which comprises an AlN substrate, and an electrically conductive mounting layer including W, WC or $W_2C$ that electrically and mechanically connects said SiC body to said substrate.

26. The varistor circuit of claim 25, wherein said SiC body is connected to function as a switch for said operation circuit under the control of said IR source.

27. The varistor circuit of claim 25, said IR source comprising a laser which emits IR radiation within a waveband that induces a change in the resistance of said SiC body.

28. A method of employing IR radiation, comprising:
   applying an electrical signal to an SiC body, and
   applying IR radiation to said SiC body to heat said body, and thereby induce a resistance change in said body which controls the body's response to said electrical signal,
   wherein said SiC body is secured in a mounting structure which comprises an AlN substrate, and an electrically conductive mounting layer including W, WC or $W_2C$ that electrically and mechanically connects said SiC body to said substrate.

29. The method of claim 28, wherein said applied electrical signal comprises a voltage or current signal, further comprising the step of sensing the resultant current through the SiC body in the case of an applied voltage signal or the resultant voltage across the SiC body in the case of an applied current signal to obtain an indication of the power or energy of said IR radiation.

30. The method of claim 28, further comprising the steps of exposing said SiC body and a test body whose temperature it is desired to measure to directly related levels of IR radiation, and sensing the SiC body's response to said electrical signal as an indication of the temperature of said test body.

31. The method of claim 28, wherein said SiC body is connected as a varistor in an electrical circuit which applies said electrical signal to the body, and the intensity of the IR radiation applied to said body is controlled to control its resistance and thereby the functioning of said electrical circuit.

32. The method of claim 28, wherein said SiC body is doped to adjust its spectral response to IR radiation.

* * * * *